United States Patent
Yamamoto et al.

(10) Patent No.: US 8,421,560 B2
(45) Date of Patent: *Apr. 16, 2013

(54) BOUNDARY ACOUSTIC WAVE RESONATOR AND LADDER FILTER

(75) Inventors: Daisuke Yamamoto, Nagaokakyo (JP); Nobuhira Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/251,361

(22) Filed: Oct. 3, 2011

(65) Prior Publication Data

US 2012/0025931 A1 Feb. 2, 2012

Related U.S. Application Data

(63) Continuation of application No. PCT/JP2010/056233, filed on Apr. 6, 2010.

(30) Foreign Application Priority Data

Apr. 7, 2009 (JP) ................................. 2009-093116

(51) Int. Cl.
*H03H 9/64* (2006.01)
*H03H 9/25* (2006.01)

(52) U.S. Cl.
USPC ...................................... 333/195; 310/313 D

(58) Field of Classification Search .......... 333/193–196, 333/133; 310/313 B, 313 D
See application file for complete search history.

(56) References Cited

U.S. PATENT DOCUMENTS

| | | | |
|---|---|---|---|
| 6,346,761 B1 | 2/2002 | Isobe et al. | |
| 7,812,688 B2* | 10/2010 | Nakamura et al. | 333/133 |
| 7,872,548 B2* | 1/2011 | Nishihara et al. | 333/133 |
| 7,915,976 B2* | 3/2011 | Tanaka | 333/195 |

(Continued)

FOREIGN PATENT DOCUMENTS

| | | |
|---|---|---|
| EP | 1 187 324 A2 | 3/2002 |
| JP | 2-170610 A | 7/1990 |

(Continued)

OTHER PUBLICATIONS

Isobe et al., "A Miniature High-Q Grating-Mode-Type SAW Resonator and a Wide-Band 1-GHz SAW-VCO for Mobile Communications," Mircowave Symposium Digest, IEEE MTTS-International, Jun. 16, 2000, vol. 2, pp. 917-920.

(Continued)

*Primary Examiner* — Barbara Summons
(74) *Attorney, Agent, or Firm* — Keating & Bennett, LLP

(57) ABSTRACT

In a boundary acoustic wave resonator, apodization weighting is performed on an IDT electrode so that an intersecting width decreases as a location moves outward in a boundary acoustic wave propagation direction. An inner side of a first busbar includes inclined portions that are disposed a predetermined distance from an envelope portion B1 on the side of the first busbar. An inner side of a second busbar includes inclined portions that are disposed a predetermined distance from an envelope portion on the side of second busbar. The sum of the numbers of electrode fingers and dummy electrodes that a straight line extending from the end of at least one of electrode fingers in the boundary acoustic wave propagation direction crosses before reaching the side of the first busbar or the side of the second busbar is equal to or greater than 5.

6 Claims, 8 Drawing Sheets

U.S. PATENT DOCUMENTS

| | | | |
|---|---|---|---|
| 7,928,633 B2 * | 4/2011 | Iwasaki et al. | 310/313 R |
| 8,169,278 B2 * | 5/2012 | Takamine | 333/133 |
| 2001/0011932 A1 | 8/2001 | Takamiya et al. | |
| 2008/0074212 A1 * | 3/2008 | Matsuda et al. | 333/195 |

FOREIGN PATENT DOCUMENTS

| | | | |
|---|---|---|---|
| JP | 7-240658 | * | 9/1995 |
| JP | 2000-286663 A | | 10/2000 |
| JP | 2001-298348 A | | 10/2001 |
| JP | 2002-084162 A | | 3/2002 |
| JP | 2010-16523 | * | 1/2010 |
| WO | WO 2009/050932 | * | 4/2009 |

OTHER PUBLICATIONS

Official Communication issued in International Patent Application No. PCT/JP2010/056233, mailed on Jul. 13, 2010.

* cited by examiner

BOUNDARY ACOUSTIC WAVE RESONATOR AND LADDER FILTER

BACKGROUND OF THE INVENTION

1. Field of the Invention

The present invention relates to a boundary acoustic wave resonator in which reflectors are disposed on either side of an IDT electrode in a boundary acoustic wave propagating direction and a ladder filter including the boundary acoustic wave resonator, and, more particularly, to a boundary acoustic wave resonator in which apodization weighting is performed on an IDT electrode, and also relates to a ladder filter including the boundary acoustic wave resonator.

2. Description of the Related Art

Surface acoustic wave resonators are widely used in communication apparatuses, such as mobile telephones, to form resonators or filters.

For example, Japanese Unexamined Patent Application Publication No. 2000-286663 discloses a surface acoustic wave resonator 1001 illustrated in FIG. 12. In the surface acoustic wave resonator 1001, an electrode structure illustrated in Fig. is provided on a piezoelectric substrate. The surface acoustic wave resonator 1001 uses a Love wave having an electrochemical coefficient $k^2$ larger than that of a Rayleigh wave.

In the surface acoustic wave resonator 1001, an IDT electrode 1002 is formed on the piezoelectric substrate. The IDT electrode 1002 includes a busbar 1003 and a busbar 1004 facing the busbar 1003. The busbar 1003 includes a busbar portion 1003a extending in a direction inclined at an angle of θ with respect to a surface wave propagating direction and a busbar portion 1003b that extends in a direction inclined at an angle of −θ with respect to a surface acoustic wave propagating direction and is connected to the busbar portion 1003a.

Similarly, The second busbar 1004 includes a busbar portion 1004a extending in a direction inclined at an angle of −θ with respect to the surface acoustic wave propagating direction and a busbar portion 1004b that is connected to the busbar portion 1004a and extends in a direction inclined at an angle of θ with respect to the surface acoustic wave propagating direction.

The busbar portions 1003a, 1003b, 1004a, and 1004b form a substantially rhombus shape.

A plurality of electrode fingers 1005 extend from the busbar portions 1003a and 1003b toward the busbar portions 1004a and 1004b. Dummy electrodes 1006 are disposed to face the ends of the electrode fingers 1005 with gaps therebetween. One end of each of the dummy electrodes 1006 is connected to the second busbar 1004 and the other end thereof faces the electrode fingers 1005 with the above-described gaps therebetween.

A plurality of electrode fingers 1007 is similarly disposed. One end of each of the electrode fingers 1007 is connected to the second busbar 1004 and the other end thereof extends toward the first busbar 1003. Dummy electrodes 1008 are disposed to face the ends of the electrode fingers 1007 with gaps therebetween in the length direction of the electrode fingers. One end of each of the dummy electrodes 1008 is connected to the first busbar 1003 and the other end thereof faces the electrode fingers 1007 with the above-described gaps therebetween.

The electrode fingers 1005 and the electrode fingers 1007 are alternately disposed in the surface acoustic wave propagating direction. Apodization weighting is performed on the IDT electrode 1002. The apodization weighting provides a maximum intersecting width at the center of the IDT electrode in the surface wave propagating direction. The intersecting width decreases as the distance from the center in the surface wave propagating direction increases.

In the surface acoustic wave resonator 1001, the minimum intersecting width is zero. There are areas at the ends of the IDT electrode in the surface acoustic wave propagating direction in which only the dummy electrodes 1006 and 1008 are present.

A feature of the surface acoustic wave resonator 1001 is that apodization weighting is performed as described above and an envelope A obtained by the apodization weighting is parallel to the inner sides of the busbar portions 1003a, 1003b, 1004a, and 1004b. That is, the inner sides of the busbar portions 1003a to 1004b are arranged so that they are parallel to the envelope. The inner sides of the busbar portions 1003a to 1004b are inclined at an angle of θ or −θ with respect to the surface wave propagating direction. For this reason, resonance in an anharmonic higher-order mode rarely occurs. This leads to the suppression of a spurious response. In particular, as disclosed in Japanese Unexamined Patent Application Publication No. 2000-286663, portions between the above-described envelope and the inner sides of the busbars extending in parallel with the envelope function as reflectors. Accordingly, for example, as represented by a straight line $L_o$ in FIG. 13, an excited surface acoustic wave crosses, for example, five electrode fingers before reaching the inner side of the busbar portion 1003b. Since these five electrode fingers function as reflectors, a spurious response can be effectively suppressed. This leads to size reduction.

On the other hand, since a space above an IDT electrode is not required in a boundary acoustic wave resonator, boundary acoustic wave resonators are attracting attention. As in surface acoustic wave resonators, it is also necessary to suppress a spurious response in boundary acoustic wave resonators.

Surface acoustic wave resonators are used to form oscillation circuits, filters, and other devices. To form a filter circuit, a plurality of surface acoustic wave resonators is typically connected. For example, in a ladder filter including a plurality of surface acoustic wave resonators, at least one surface acoustic wave resonator is connected to a series arm and at least one surface acoustic wave resonator is connected to a parallel arm. In a ladder filter, attenuation is not sufficiently increased in a band higher than a passband when the impedance of a series arm resonator at an anti-resonant frequency is not sufficiently high.

In a parallel arm resonator, an insertion loss may be increased in a passband when the impedance thereof at an anti-resonant frequency is not sufficiently high.

However, in the surface acoustic wave resonator disclosed in Japanese Unexamined Patent Application Publication No. 2000-286663, the impedance thereof at an anti-resonant frequency is not sufficiently high. A return loss is increased in a frequency band higher than the anti-resonant frequency, for example, at a frequency that is approximately 1.003 times the anti-resonant frequency. For this reason, an insertion loss is increased in a higher portion of the passband of a ladder filter including the surface acoustic wave resonator as a parallel arm resonator.

On the other hand, as in surface acoustic wave resonators, in boundary acoustic wave resonators, it is also necessary to suppress a spurious response caused by resonance in a higher-order mode and to obtain a high impedance at an anti-resonant frequency when such a boundary acoustic wave resonator is used in a ladder filter.

SUMMARY OF THE INVENTION

To overcome the above-described problems, preferred embodiments of the present invention provide a boundary acoustic wave resonator that is capable of preventing a spurious response caused by resonance in an anharmonic higher-order mode and obtaining a sufficiently high impedance at an anti-resonant frequency and a ladder filter that includes the boundary acoustic wave resonator as a parallel arm resonator or as a series arm resonator and that reduces an insertion loss in a passband.

A boundary acoustic wave resonator according to a preferred embodiment of the present invention preferably includes a piezoelectric substrate, a first dielectric layer laminated on the piezoelectric substrate, an IDT electrode provided at an interface between the piezoelectric substrate and the first dielectric layer, and a pair of reflectors disposed at the interface on both sides of the IDT electrode in a boundary acoustic wave propagating direction. The IDT electrode preferably includes a first busbar, a second busbar, a plurality of first electrode fingers extending from the first busbar toward the second busbar, a plurality of second electrode fingers extending from the second busbar toward the first busbar, first dummy electrodes that face ends of the plurality of first electrode fingers with gaps therebetween and are connected to the second busbar, and second dummy electrodes that face ends of the plurality of the second electrode fingers with gaps therebetween and are connected to the first busbar.

Preferably, apodization weighting is performed on the IDT electrode so that an intersecting width of an electrode finger decreases towards both ends of the IDT electrode in the boundary acoustic wave propagating direction from a location at which the maximum intersecting width of the electrode finger is obtained. A side of the first busbar to which the plurality of first electrode fingers and the second dummy electrodes are connected preferably includes an inclined portion that is inclined with respect to the boundary acoustic wave propagating direction so that the side of the first busbar is disposed a predetermined distance from an envelope obtained by the apodization weighting. A side of the second busbar to which the plurality of second electrode fingers and the first dummy electrodes are connected preferably includes an inclined portion that is inclined with respect to the boundary acoustic wave propagating direction so that the side of the second busbar is disposed a predetermined distance from the envelope obtained by the apodization weighting. A length of an electrode finger of each of the pair of reflectors that is adjacent to an outermost electrode finger of the IDT electrode is preferably substantially equal to a sum of a length of the outermost electrode finger of the IDT electrode and a length of a dummy electrode facing an end of the outermost electrode finger. A sum N of the numbers of electrode fingers and dummy electrodes that a straight line extending from an end of at least one of electrode fingers of the IDT electrode in the boundary acoustic wave propagating direction crosses before reaching one of the sides of the first busbar and the second busbar is preferably equal to or greater than 5, for example, and the number of electrode fingers included in one of the pair of reflectors is approximately N.

N is preferably equal to or greater than 10, for example. In this case, when the boundary acoustic wave resonator is used as a parallel arm resonator in a ladder filter, it is possible to further increase an impedance at an anti-resonant frequency and reduce a return loss in a higher portion of a passband.

In a boundary acoustic wave resonator according to a preferred embodiment of the present invention, N is preferably equal to or less than 50, for example. When N is too large, the slope of a busbar decrease and the size of the boundary acoustic wave resonator is increased. Accordingly, as described previously, N is preferably equal to or less than 50, for example.

In a boundary acoustic wave resonator according to a preferred embodiment of the present invention, a second dielectric layer having a velocity of sound greater than that of the first dielectric layer is preferably laminated on the first dielectric layer. In this case, it is possible to confine the energy of a boundary acoustic wave in an area inside the second dielectric layer.

A ladder filter according to another preferred embodiment of the present invention preferably includes series arm resonators and parallel arm resonators. At least two resonators of the series arm resonators and the parallel arm resonators are the boundary acoustic wave resonators according to a preferred embodiment of the present invention.

In a ladder filter according to the present invention, the at least two boundary acoustic wave resonators are preferably a first boundary acoustic wave resonator and a second boundary acoustic wave resonator whose boundary wave propagating directions are parallel or substantially parallel to each other. A straight line extending from an end of at least one of electrode fingers in an IDT of the first boundary acoustic wave resonator in the boundary wave propagating direction is preferably disposed at a intersecting portion of electrode fingers in an IDT of the second boundary acoustic wave resonator. In this case, since the distance between the first and second boundary acoustic wave resonators can be reduced, a ladder filter can be reduced in size.

Outer sides of the first and second busbars of the first and second boundary acoustic wave resonators which are opposite sides to which one of the first and second electrode fingers and one of the second and first dummy electrodes are connected are preferably inclined so that the outer sides are disposed a predetermined distance from the envelope. The second busbar of the second boundary acoustic wave resonator is preferably disposed outside the outer side of the first busbar of the first boundary acoustic wave resonator in a direction perpendicular or substantially perpendicular to the boundary acoustic wave propagating direction. In this case, the ladder filter can be further reduced in size.

In a boundary acoustic wave resonator according to various preferred embodiments of the present invention, a side of a first busbar to which first electrode fingers and second dummy electrodes are connected preferably includes an inclined portion that is inclined so that the side of the first busbar is disposed a predetermined distance from an envelope obtained by apodization weighting. A side of a second busbar to which second electrode fingers and first dummy electrodes are connected similarly includes an inclined portion. As a result, as in the surface acoustic wave resonator disclosed in Japanese Unexamined Patent Application Publication No. 2000-286663, resonance in an anharmonic higher-order mode rarely occurs and a spurious response is prevented. In a preferred embodiment of the present invention, a sum N of the numbers of electrode fingers and dummy electrodes that a straight line extending from an end of at least one of electrode fingers of an IDT electrode in a boundary acoustic wave propagating direction crosses before reaching one of the sides of the first busbar and the second busbar is preferably equal to or greater than 5, for example, and the number of electrode fingers included in one of the pair of reflectors is approximately N. Accordingly, an impedance at an anti-resonant frequency can be sufficiently increased.

Accordingly, by using a boundary acoustic wave resonator according to various preferred embodiments of the present invention in a ladder filter as a series arm resonator, an impedance at an anti-resonant frequency can be increased and attenuation in a band higher than a passband can therefore be sufficiently increased. Furthermore, a return loss in a higher portion of the passband is reduced. Still furthermore, by using the boundary acoustic wave resonator as a parallel arm resonator, an insertion loss in the passband is sufficiently reduced. Accordingly, it is possible to provide a ladder filter having an excellent filter characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the accompanying drawings.

Figure 1A:
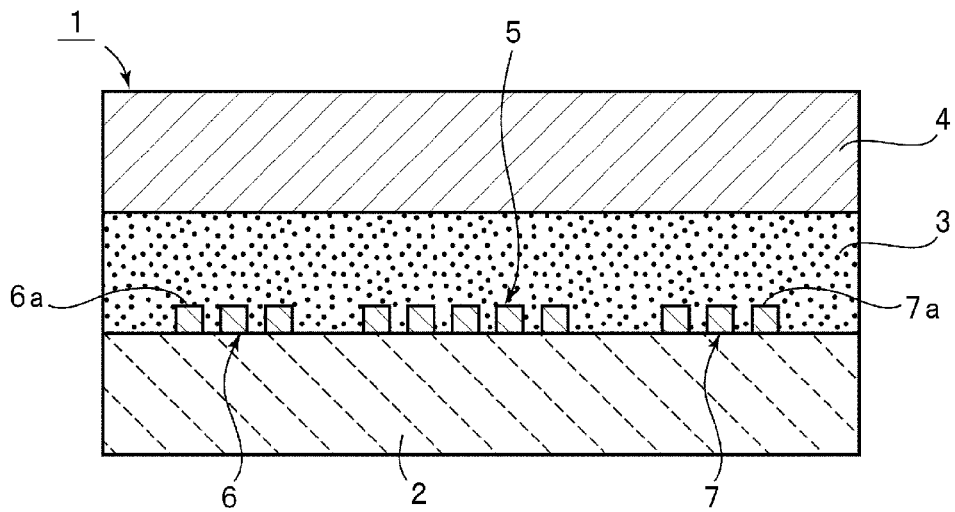
FIG. 1A is a schematic elevational cross-sectional view of a boundary acoustic wave resonator according to a preferred embodiment of the present invention.
Figure 1B:
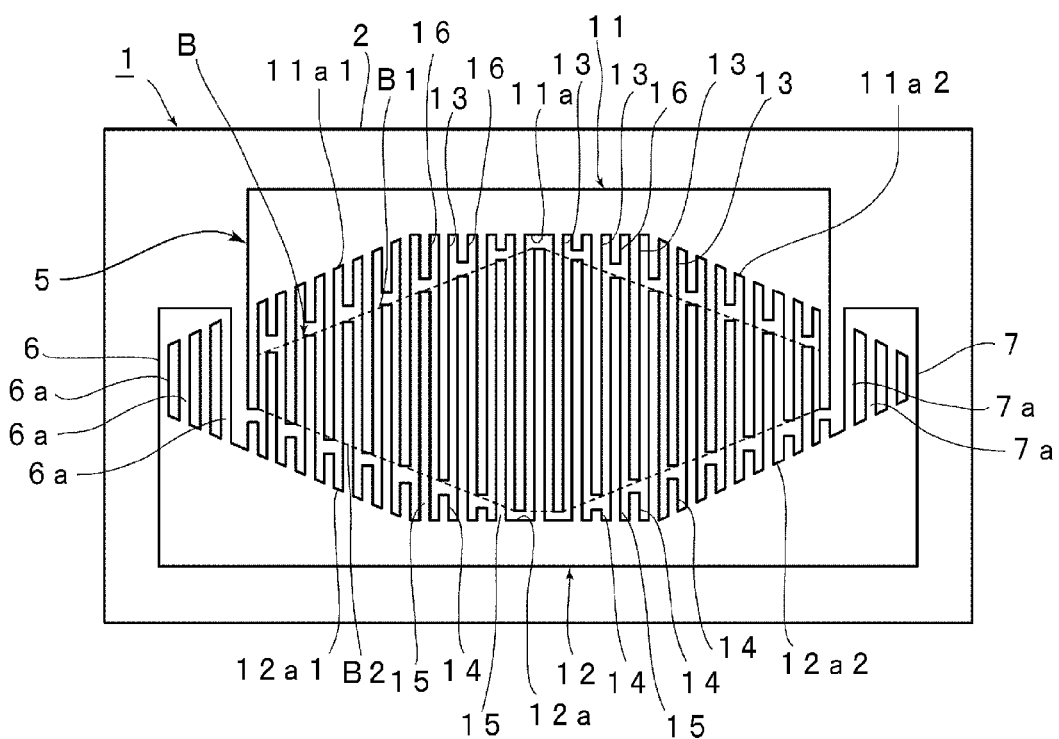
FIG. 1B is a schematic plan view illustrating the electrode structure of a boundary acoustic wave resonator according to a preferred embodiment of the present invention.

FIG. 1A is a schematic elevational cross-sectional view describing a boundary acoustic wave resonator according to a preferred embodiment of the present invention. FIG. 1B is a schematic plan cross-sectional view illustrating the electrode structure of a boundary acoustic wave resonator according to a preferred embodiment of the present invention. A boundary acoustic wave resonator 1 preferably has a layered structure preferably including a first dielectric layer 3 and a second dielectric layer 4 that are laminated in this order on a piezoelectric substrate 2. That is, the boundary acoustic wave resonator 1 is preferably a boundary acoustic wave apparatus having a three-medium structure.

The piezoelectric substrate 2 is preferably a Y—X $LiNbO_3$ substrate having a cut angle of 25°, for example. The piezoelectric substrate 2 may be made of another piezoelectric monocrystal, such as $LiTaO_3$ or quartz crystal or piezoelectric ceramic such as lead zirconate titanate ceramic, for example.

The first dielectric layer 3 is preferably made of $SiO_2$, for example, in this preferred embodiment. The second dielectric layer 4 is preferably made of a dielectric having a velocity of sound higher than that of the first dielectric layer 3, and is made of SiN, for example, in this preferred embodiment.

Materials for the first dielectric layer 3 and the second dielectric layer 4 are not limited to the above-described materials, and may be an appropriate dielectric material, such as SiO, SiN, SiON, or SiC, for example. Since the velocity of sound of the second dielectric layer 4 is higher than that of the first dielectric layer, a boundary acoustic wave can be confined in an area inside the second dielectric layer 4 with certainty. Preferred embodiments of the present invention are not limited to a boundary acoustic wave apparatus having a three-medium structure, and the second dielectric layer 4 may not be provided.

At the interface between the piezoelectric substrate 2 and the first dielectric layer 3, the electrode structure illustrated in FIG. 1B is preferably provided. That is, an IDT electrode 5, a reflector 6 on one side of the IDT electrode 5 in a boundary acoustic wave propagating direction, and a reflector on the other side of the IDT electrode 5 in the boundary acoustic wave propagating direction are provided.

One of the unique features of the boundary acoustic wave resonator 1 according to this preferred embodiment is the electrode structure including the IDT electrode 5 and the reflectors 6 and 7.

More specifically, the IDT electrode 5 preferably includes a first busbar 11 and a second busbar 12 facing the first busbar 11. A plurality of first electrode fingers 13 extend from an inner side 11a of the first busbar 11 toward the second busbar 12. First dummy electrodes 14 face the ends of the first electrode fingers 13 with gaps therebetween. That is, the first dummy electrodes 14 extending in the extending direction of the first electrode fingers 13 face the ends of the first electrode fingers 13 with the gaps therebetween. One end of each of the first dummy electrodes 14 is connected to an inner side 12a of the second busbar 12 and the other end thereof faces the first electrode fingers 13 with the above-described gaps therebetween.

Second electrode fingers 15 similarly extend from the inner side 12a of the second busbar 12 toward the first busbar 11. Second dummy electrodes 16 face the ends of the second electrode fingers 15 with gaps therebetween. One end of each of the second dummy electrodes 16 is connected to the inner side 11a of the first busbar 11 and the other end thereof faces the ends of the second electrode fingers 15 with the above-described gaps therebetween.

Apodization weighting is preferably performed on the IDT electrode 5. The apodization weighting is performed so that the maximum intersecting width is obtained at the approximate center of the IDT electrode 5 in a boundary acoustic wave propagating direction, that is, in a direction perpendicular or substantially perpendicular to the extending direction of the electrode fingers 13 and 15, and the intersecting width decreases towards both ends of the IDT electrode 5 in the boundary acoustic wave propagating direction.

Accordingly, an envelope portion B1 of an envelope B surrounding an apodization-weighted area near the first busbar 11 approaches an envelope portion B2 of the envelope B near the second busbar 12 as the envelope portion B1 gets closer to the left and right ends from the approximate center of the IDT electrode 5 illustrated in FIG. 1.

At the approximate center of the IDT electrode 5 in the boundary acoustic wave propagating direction, the second envelope portion B2 is the outermost portion in the direction perpendicular or substantially perpendicular to the boundary acoustic wave propagating direction. The envelope portion B2 approaches the envelope portion B1 as the envelope portion B2 gets closer to both ends of the IDT electrode 5 in the boundary acoustic wave propagating direction.

On the other hand, the inner side 11a of the first busbar 11 preferably includes portions 11a1 and 11a2 that are inclined so that the distance between the inner side 11a and the envelope portion B1 near the first busbar 11 is substantially constant. Similarly, the inner side 12a of the second busbar 12 preferably includes inclined portions 12a1 and 12a2. The inclined portions 12a1 and 12a2 are parallel or substantially parallel to the envelope portion B2.

Accordingly, as in the case of the surface acoustic wave resonator 1001 disclosed in Japanese Unexamined Patent Application Publication No. 2000-286663, in the IDT electrode 5, the dummy electrodes and the electrode finger portions that function as a reflector in an area outside the apodization-weighted area in a direction perpendicular or substantially perpendicular to the boundary acoustic wave propagating direction have a relatively small length. Since the area functioning as the reflector is inclined with respect to the group velocity direction of boundary acoustic waves, resonance in the anharmonic higher-order mode rarely occurs. As a result, a spurious response caused by the resonance in the anharmonic higher-order mode is prevented.

The reflectors 6 and 7 preferably include a plurality of electrode fingers 6a and a plurality of electrode fingers 7a, respectively. Both ends of each of the electrode fingers 6a and 7a are short-circuited. The electrode fingers 6a and 7a are parallel or substantially parallel to the electrode fingers 13 and 15 of the IDT electrode 5.

The length of the electrode finger 6a of the reflector or the electrode finger 7a of the reflector 7 next to the outermost electrode finger 13 or 15 of the IDT electrode 5 in the boundary acoustic wave propagating direction is preferably substantially equal to the sum of the length of the outermost electrode finger and the length of the first dummy electrode 14 or the second dummy electrode 16 facing the end of the outermost electrode finger.

Another unique feature of the boundary acoustic wave resonator 1 according to this preferred embodiment is that a spurious response in the anharmonic higher-order mode is effectively prevented, since the inner side 11a of the first busbar 11 includes the inclined portions 11a1 and 11a2 substantially parallel to the envelope portion B1 of the envelope obtained by apodization weighting and the inner side 12a of the second busbar 12 includes the inclined portions 12a1 and 12a2 substantially parallel to the envelope portion B2 of the envelop.

Figure 2:
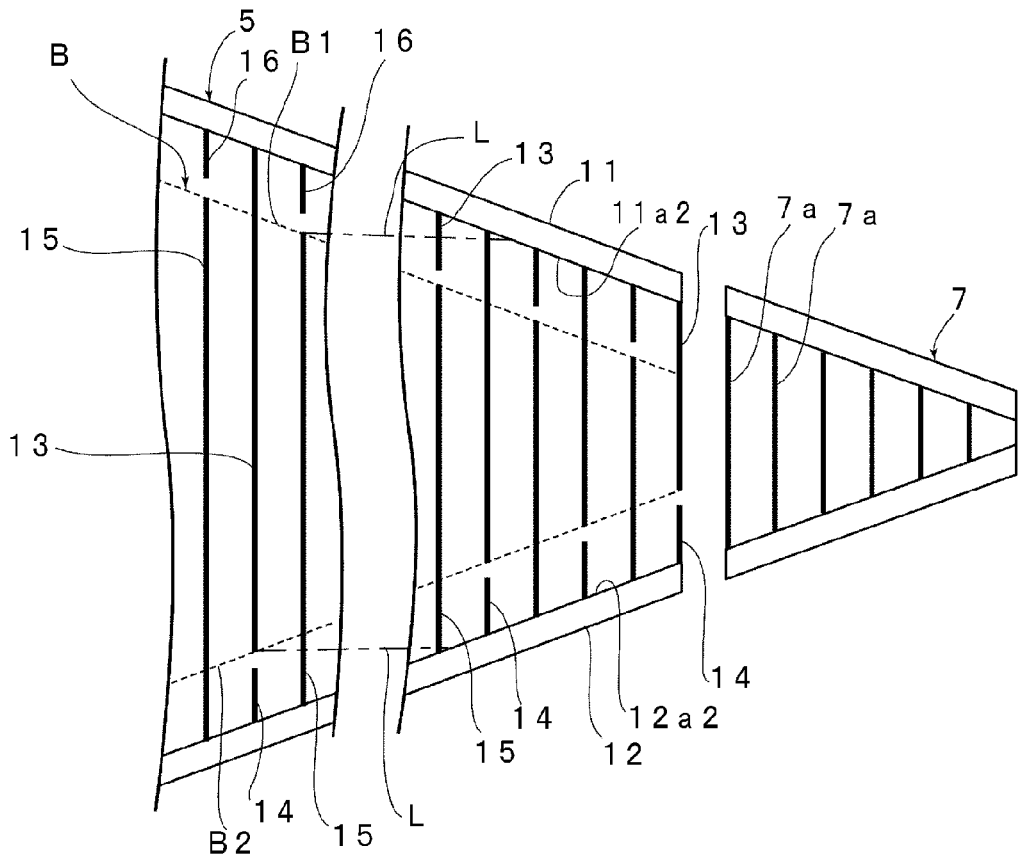
FIG. 2 is a schematic elevational cross-sectional view illustrating the layered structure of boundary acoustic wave elements according to a preferred embodiment illustrated in FIG. 1A and FIG. 1B.

As illustrated in FIG. 2, another unique feature of the boundary acoustic wave resonator 1 according to this preferred embodiment is that the sum N of the numbers of electrode fingers and dummy electrodes that a straight line L extending from the end of at least one of the electrode fingers 13 and 15 in the boundary acoustic wave propagating direction crosses before reaching the inner side 11a of the first busbar 11 or the inner side 12a of the second busbar 12 is equal to or greater than 5, for example, and the number of the electrode fingers 6a of the reflector 6 and the number of the electrode fingers 7a of the reflector 7 are approximately N. As a result, an impedance at the anti-resonant frequency is sufficiently increased. In addition, when a ladder filter in which the boundary acoustic wave resonator is included as a series arm resonator or a parallel arm resonator, a characteristic in a higher portion of the passband is improved and a return loss is reduced. This will be described on the basis of specific examples of experiments.

The IDT electrode 5 was formed on the piezoelectric substrate 2 that is preferably a Y—X LiNbO$_3$ substrate having a cut angle of about 25° using a photolithography method, for example, and the following characteristics.

Wavelength depending on electrode finger pitch: about 2.1 μm

The number of pairs of electrode fingers: 130

Duty ratio=about 0.5

Electrode finger intersecting width of electrode finger: about 42.0λ

Opening width: about 42.2λ

Apodization weighting was performed so that an intersecting width was about 41.9λ at the approximate center of an IDT electrode and was about 4.3λ at both ends of the IDT electrode.

The above-described N is set to 16.

The widths of the gaps located at the ends of the first and second electrode fingers, that is, the sizes of the gaps in a direction perpendicular or substantially perpendicular to the boundary acoustic wave propagating direction, were set to about 0.3 μm. The lengths of the first dummy electrode 14 and the second dummy electrode 16 at the approximate center of the IDT electrode 5 were set to zero. The lengths of the dummy electrodes at both ends of the IDT electrode 5 in the boundary acoustic wave propagating direction were proportional to the number of dummy electrodes, and were set to about 6.0 μm when the total number of the second dummy electrodes was 10.

The number of electrode fingers of each reflector was set to 15. The duty ratio of each reflector was set to about 0.5. The opening length of the electrode fingers of the reflectors 6 and 7 was set so that it was equal or substantially equal to an opening length at both ends of the IDT electrode 5 in the boundary acoustic wave propagating direction, that is, the sum of the intersecting width and a length that is about twice the length of the dummy electrode.

Here, λ represents a wavelength depending on an electrode finger pitch.

The IDT electrode 5 and the reflectors 6 and 7 were preferably formed by laminating a plurality of metal films. Details of the layered structure and the thickness of each metal film will be described below.

The order of lamination of metal films and the thickness of each of the metal films are as follows. Ti film/Pt film/Ti film/AlCu film/Ti film/Pt film/NiCr film 10/36/10/225/10/22/10 (nm), for example.

After the formation of the IDT electrode 5 and the reflectors 6 and 7 on the above-described piezoelectric substrate, an SiO$_2$ layer with a thickness of about 1213 nm was formed as the first dielectric layer 3 and an SiN layer with a thickness of about 2200 nm was formed as the second dielectric layer 4 using the sputtering method.

A boundary acoustic wave resonator in the related art having a configuration that is substantially the same as that of the above-described boundary acoustic wave resonator except that N is zero was created.

The resonance characteristics of the boundary acoustic wave resonator according to a preferred embodiment and the boundary acoustic wave resonator in the related were measured. Referring to FIGS. 3 to 6, a solid line indicates an experimental result in the boundary acoustic wave resonator according to a preferred embodiment and a broken line indicates an experimental result in the boundary acoustic wave resonator in the related art.

Figure 3:
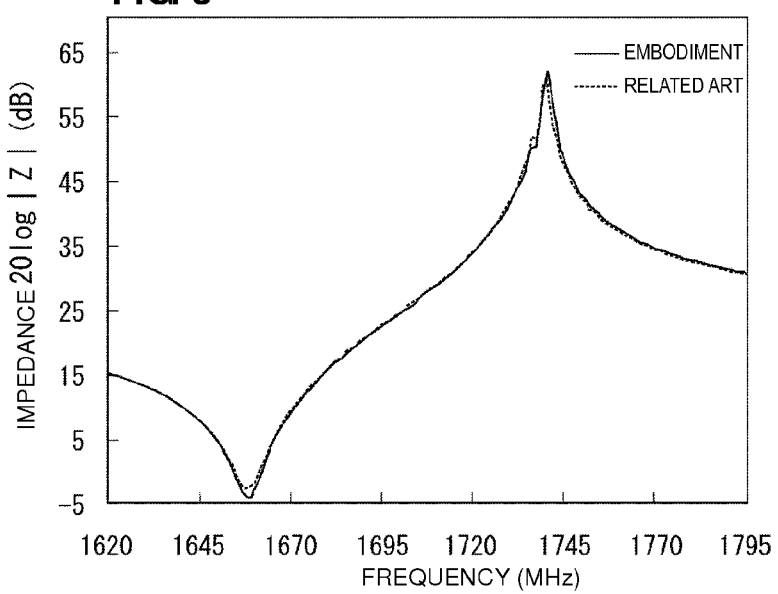
FIG. 3 is a diagram illustrating the impedance frequency characteristics of a boundary acoustic wave resonator according to a preferred embodiment and a boundary acoustic wave resonator in the related art.
Figure 4:
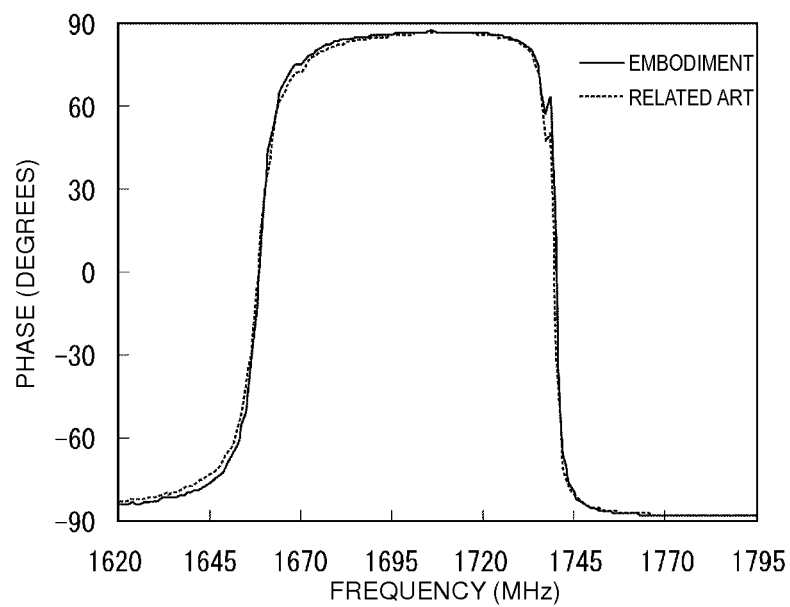
FIG. 4 is a diagram illustrating the phase frequency characteristics of a boundary acoustic wave resonator according to a preferred embodiment and a boundary acoustic wave resonator in the related art.
Figure 5:
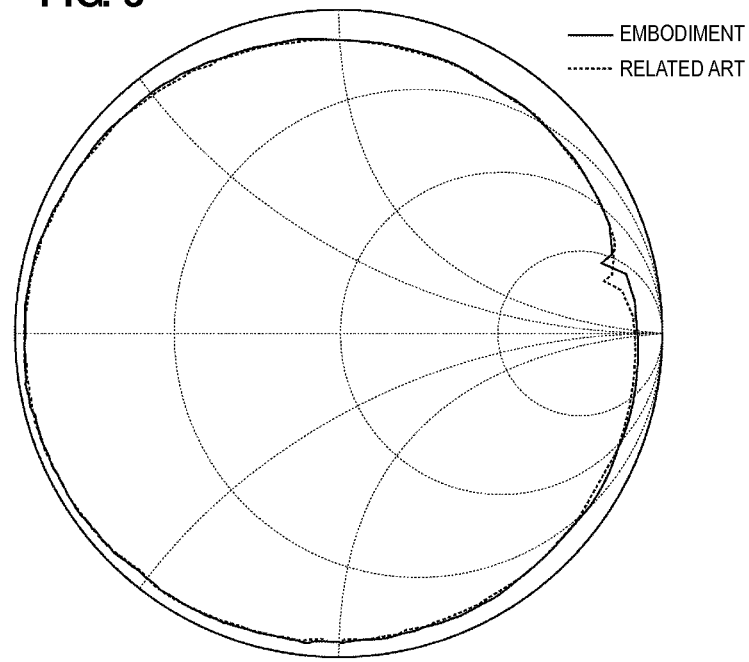
FIG. 5 is a diagram illustrating impedance Smith charts of a boundary acoustic wave resonator according to a preferred embodiment and a boundary acoustic wave resonator in the related art.
Figure 6:
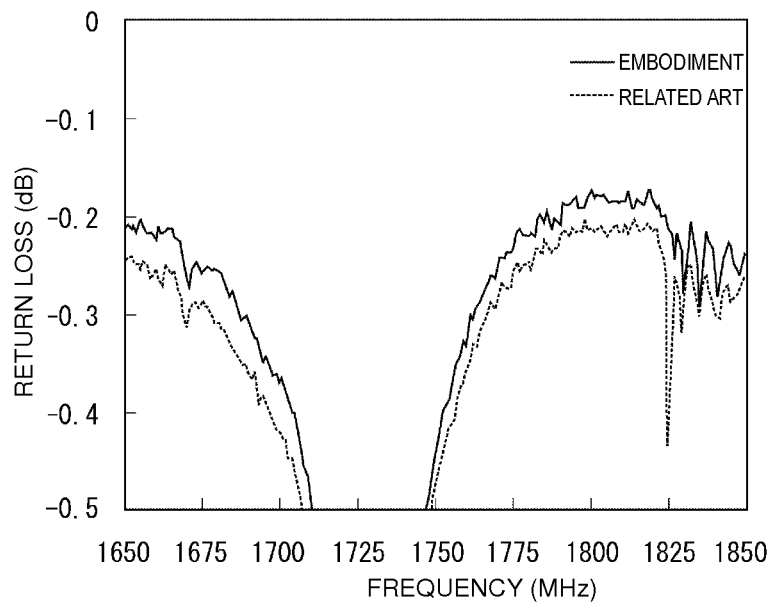
FIG. 6 is a diagram illustrating the return loss frequency characteristics of a boundary acoustic wave resonator according to a preferred embodiment and a boundary acoustic wave resonator in the related art.

FIG. 3 illustrates an impedance characteristic. FIG. 4 illustrates a phase characteristic. FIG. 5 is an impedance Smith chart. FIG. 6 illustrates the frequency characteristic of a return loss.

As is apparent from FIGS. 3 to 6, an impedance at an anti-resonant frequency in a case in which a preferred embodiment is used and N=16 is much higher than that in a case in which the related art is used and N=0. According to a preferred embodiment, a return loss is also reduced. For comparison between a characteristic obtained in a case in which a preferred embodiment is used and a characteristic in a case in which the related art is used, the following table 1 is created.

TABLE 1

|  | Impedance Ratio (dB) | Fractional Bandwidth (%) | Resonant Frequency (MHz) | Anti-resonant Frequency (MHz) | Resonant Resistance (dB) | Anti-resonant Resistance (dB) |
| --- | --- | --- | --- | --- | --- | --- |
| Related art | 62.876 | 4.93 | 1657.89914 | 1739.67812 | −2.458 | 60.418 |
| Preferred Embodiment | 66.206 | 4.93 | 1657.35542 | 1739.20008 | −4.002 | 62.204 |

Figure 7:
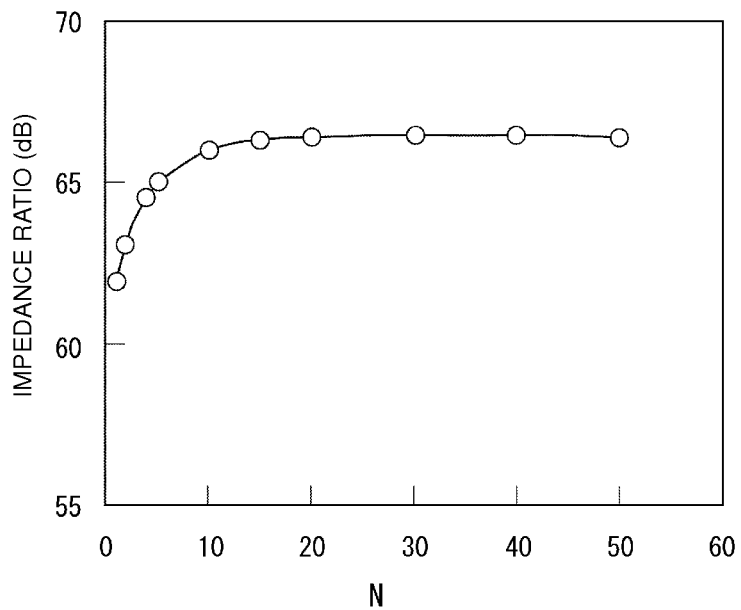
FIG. 7 is a diagram illustrating the change in an impedance ratio when N is changed.
Figure 8:
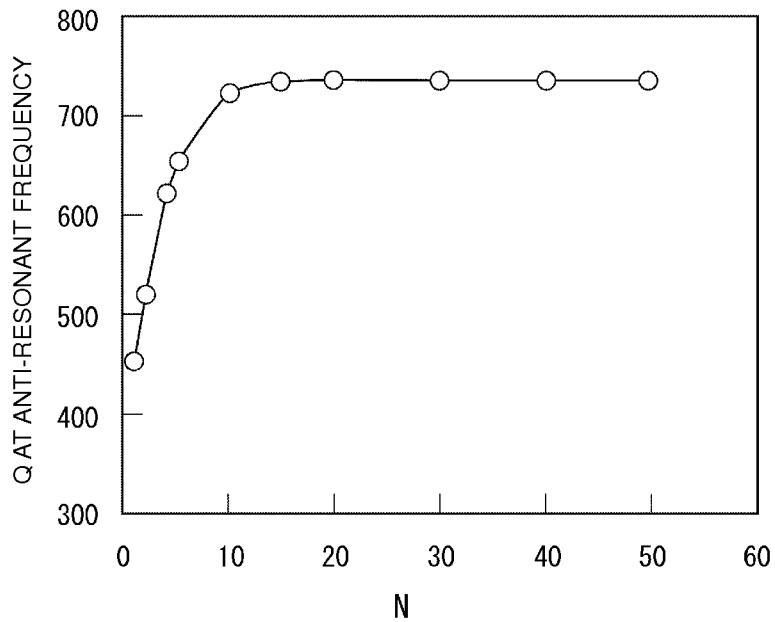
FIG. 8 is a diagram illustrating the change in Q at an anti-resonant frequency when N is changed.
Figure 9:
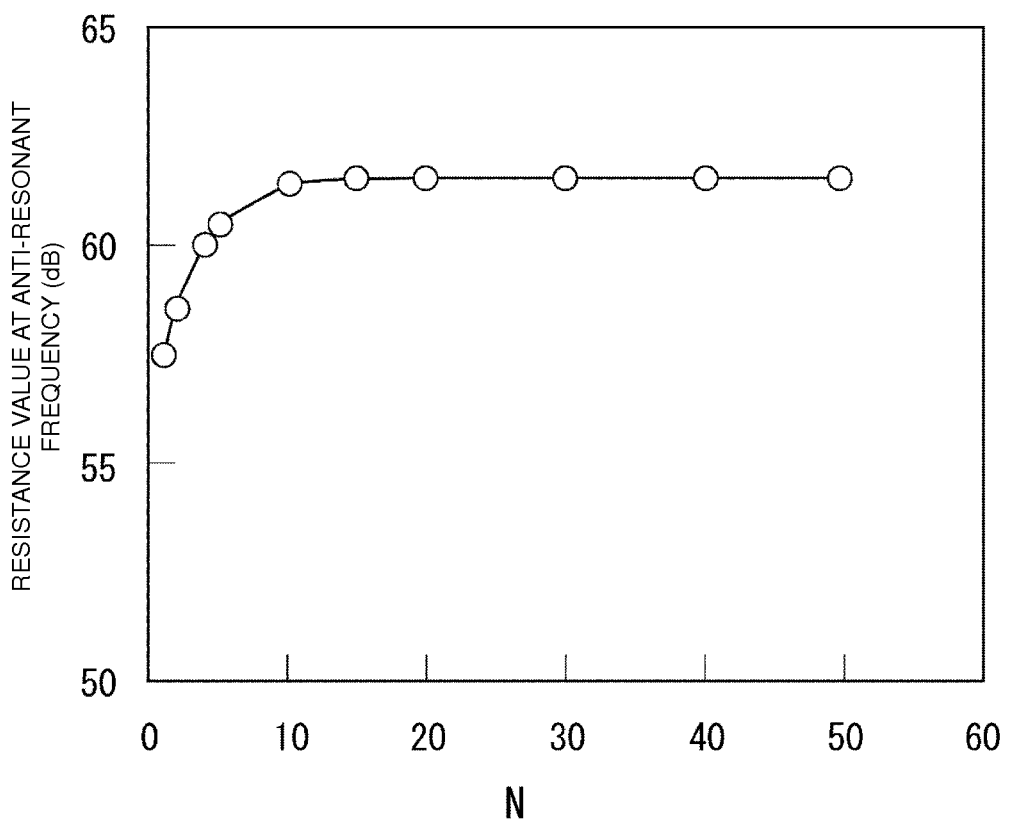
FIG. 9 is a diagram illustrating the change in a resistance value at an anti-resonant frequency when N is changed.

Next, boundary acoustic wave resonators having a configuration that is substantially the same as that of the above-described examples of experiments except that N is set to 1, 2, 4, 5, 10, 15, 20, 30, 40, and 50 were provided. Results of measurement of the impedance characteristics of these boundary acoustic wave resonators are illustrated in FIGS. 7 to 9. FIG. 7 is a diagram illustrating the relationship between an impedance radio (=an impedance at an anti-resonant frequency/an impedance at a resonant frequency) and N. FIG. 8 is a diagram illustrating the relationship between Q at an anti-resonant frequency and N. FIG. 9 is a diagram illustrating the relationship between a resistance value at an anti-resonant frequency and N.

As is apparent from FIGS. 7 to 9, when N is increased, an impedance ratio, a resistance value at an anti-resonant frequency, and Q are increased. When N exceeds 5, an impedance ratio is a large value substantially equal to or greater than about 65 dB and a resistance value at an anti-resonant frequency is a large value substantially equal to or greater than about 60.5 dB. Accordingly, N is required to be equal to or greater than 5. N is preferably equal to or greater than 10. In this case, an impedance ratio can be substantially equal to or greater than about 66 dB and a resistance value at an anti-resonant frequency can be substantially equal to or greater than about 61.5 dB.

Even when N exceeds 10, the increase in an impedance ratio and the increase in a resistance value at an anti-resonant frequency are substantially saturated. When N is too large, the slope of a busbar may decrease, the busbar may become closer in shape to a quadrilateral, and the size of a boundary acoustic wave resonator may be increased. Accordingly, in order to prevent such upsizing, it is preferable that N is equal to or less than 50.

Figure 10:
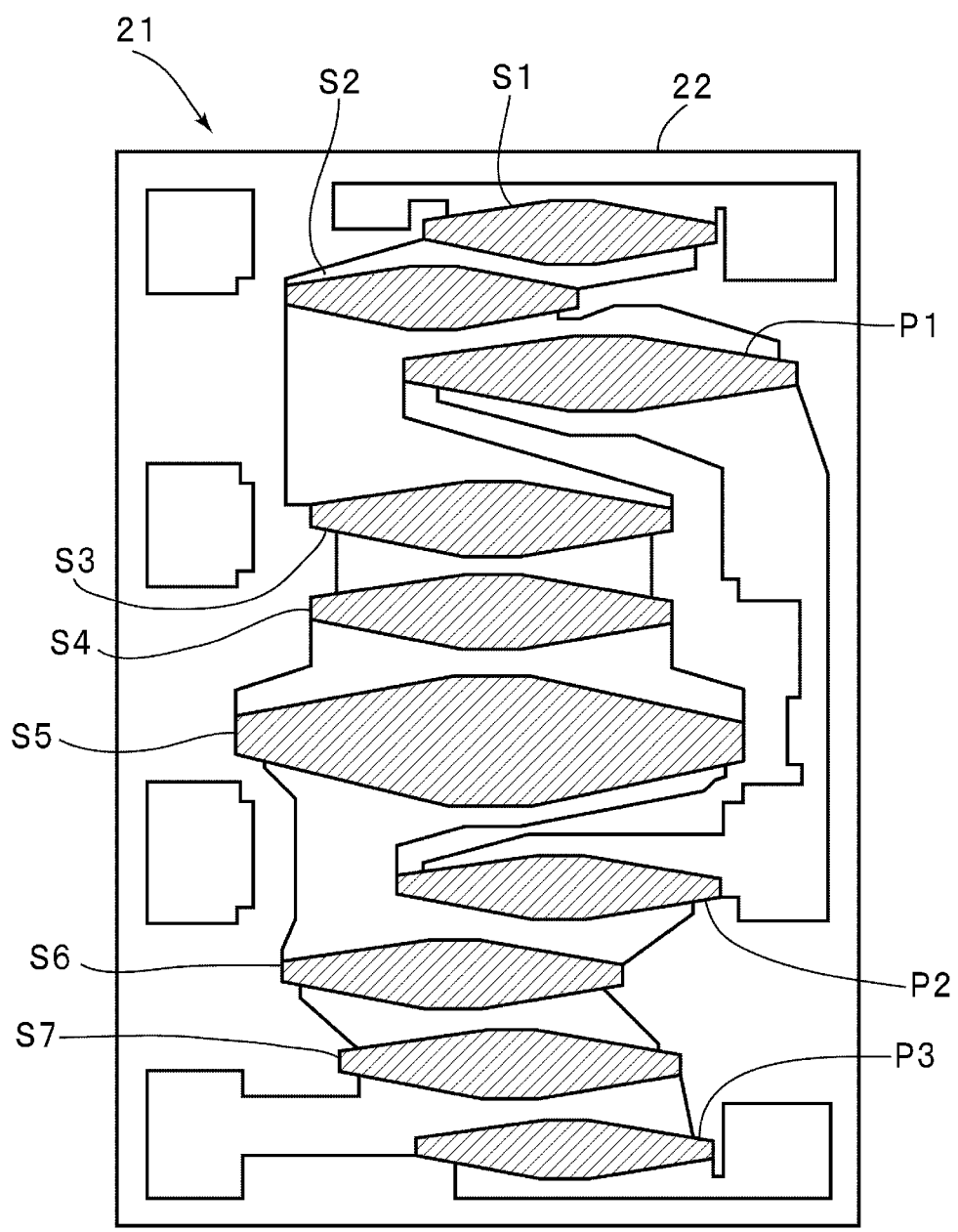
FIG. 10 is a schematic plan view of a ladder filter according to another preferred embodiment of the present invention.
Figure 11:
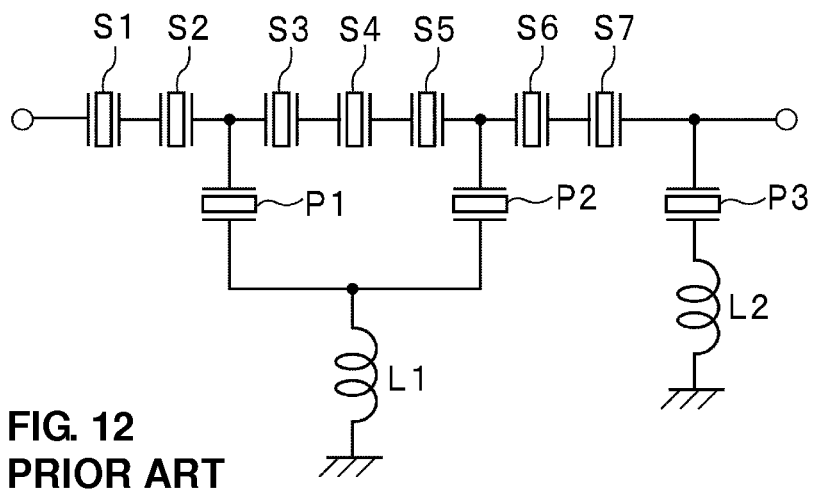
FIG. 11 is a diagram illustrating the circuit configuration of the ladder filter illustrated in FIG. 10.
Figure 12:
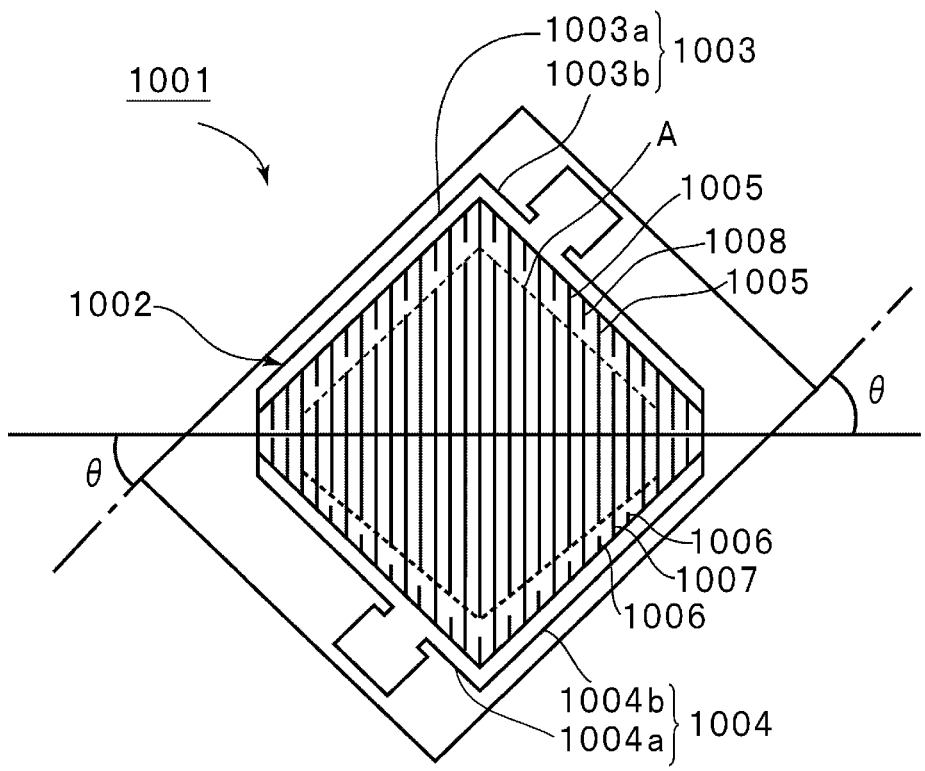
FIG. 12 is a plan view illustrating an example of a surface acoustic wave resonator in the related art.
Figure 13:
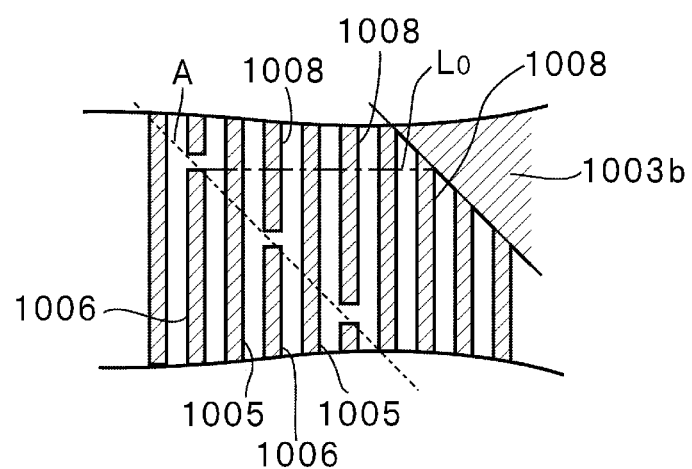
FIG. 13 is a partially-broken plan view illustrating the main portion of the surface acoustic wave resonator illustrated in FIG. 12.

FIG. 10 is a schematic plan view illustrating the electrode structure of a ladder filter according to another preferred embodiment of the present invention. The electrode structure illustrated in FIG. 1B is provided in hatched portions in FIG. 10. A ladder filter according to this preferred embodiment is preferably used as a GSM transmission filter having a center frequency of about 897.5 MHz and a passband of about 880 MHz to about 915 MHz. In FIG. 11, the illustration of the first dielectric layer 3 and the second dielectric layer 4 included in the above-described boundary acoustic wave resonator is omitted.

As illustrated in FIG. 10, in a ladder filter 21, series arm resonators S1 to S7 are provided on a piezoelectric substrate 22. In addition, parallel arm resonators P1 to P3 are provided on the piezoelectric substrate 22. By connecting the series arm resonators S1 to S7 and the parallel arm resonators P1 to P3 as illustrated in FIG. 11, the ladder filter 21 is provided. Inductors L1 illustrated in FIG. 11 are provided by an inductance element inserted between each of the parallel arm resonators P1 and P2 and a ground potential or inductances provided by wiring lines. The inductor L2 inserted between the parallel arm resonator P3 and a ground potential is preferably defined by an independently connected inductance element or an inductance provided by a wiring line.

In the ladder filter 21, since the series arm resonators S1 to S7 and the parallel arm resonators P1 to P3 are defined by boundary acoustic wave resonators according to a preferred embodiment of the present invention, the impedance of each of the boundary acoustic wave resonators at an anti-resonance frequency is sufficiently high. Accordingly, it is possible to improve an attenuation characteristic in a band higher than the passband and reduce a return loss in an attenuation band higher than the passband. As a result, a good filter characteristic is achieved.

In the boundary acoustic wave resonator 1 according to a preferred embodiment of the present invention, a single apodization-weighted portion is preferably provided in which the intersecting width decreases from the maximum intersecting width at the approximate center of the boundary acoustic wave resonator 1 towards both ends thereof in the boundary acoustic wave propagating direction. Such an apodization-weighted portion may be disposed at a plurality of positions in the boundary acoustic wave propagating direction. That is, under the assumption that the apodization-weighted portion of the boundary acoustic wave resonator 1 is considered as one cycle, the apodization-weighted portion may preferably be provided so that a plurality of cycles is obtained.

Furthermore, in the boundary acoustic wave resonator 1, preferably, the side 11a of the first busbar includes the inclined portions 11a1 and 11a2, the side 12a of the second busbar includes the inclined portions 12a1 and 12a2, and non-inclined portions are provided between the inclined portions 11a1 and 11a2 and between the inclined portions 12a1 and 12a2. However, the non-inclined portions may not be provided. That is, each of the sides 11a and 12a may include only two inclined portions extending from a portion in which the maximum intersecting width is obtained toward both ends in the boundary acoustic wave propagating direction.

Still furthermore, in the boundary acoustic wave resonator 1 according to a preferred embodiment, apodization weighting is performed so that the maximum intersecting width is obtained at the approximate center in the boundary acoustic wave propagating direction, and the intersecting width decreases towards both ends. Such an apodization-weighted portion may be provided in a plurality of cycles.

Still furthermore, in the above-described preferred embodiments, apodization weighting is performed on the reflectors 6 and 7 so that an electrode finger length varies along the boundary acoustic wave propagating direction. Normal reflectors in which an electrode finger length is constant may also be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A boundary acoustic wave resonator comprising:
    a piezoelectric substrate;
    a first dielectric layer laminated on the piezoelectric substrate;
    an IDT electrode provided at an interface between the piezoelectric substrate and the first dielectric layer; and
    a pair of reflectors disposed at the interface on both sides of the IDT electrode in a boundary acoustic wave propagating direction; wherein
    the IDT electrode includes:
        a first busbar;
        a second busbar;
        a plurality of first electrode fingers extending from the first busbar toward the second busbar;
        a plurality of second electrode fingers extending from the second busbar toward the first busbar;
        first dummy electrodes that face ends of the plurality of first electrode fingers with gaps therebetween and are connected to the second busbar; and
        second dummy electrodes that face ends of the plurality of the second electrode fingers with gaps therebetween and are connected to the first busbar;
    the IDT electrode is apodization weighted such that an intersecting width of an electrode finger decreases closer to both ends of the IDT electrode in the boundary acoustic wave propagating direction from a location at which a maximum intersecting width of the electrode finger is obtained;
    a side of the first busbar to which the plurality of first electrode fingers and the second dummy electrodes are connected includes an inclined portion that is inclined with respect to the boundary acoustic wave propagating direction so that the side of the first busbar is disposed a predetermined distance from an envelope obtained by having been apodization weighted;
    a side of the second busbar to which the plurality of second electrode fingers and the first dummy electrodes are connected includes an inclined portion that is inclined with respect to the boundary acoustic wave propagating direction so that the side of the second busbar is disposed a predetermined distance from the envelope obtained by having been apodization weighted;
    a length of an electrode finger of each of the pair of reflectors that is adjacent to an outermost electrode finger of the IDT electrode is substantially equal to a sum of a length of the outermost electrode finger of the IDT electrode and a length of a dummy electrode facing an end of the outermost electrode finger; and
    a sum N of numbers of electrode fingers and dummy electrodes that a straight line extending from an end of at least one of electrode fingers of the IDT electrode in the boundary acoustic wave propagating direction crosses before reaching one of the sides of the first busbar and the second busbar is equal to or greater than 5, and the number of electrode fingers included in one of the pair of reflectors is approximately N.

2. The boundary acoustic wave resonator according to claim 1, wherein N is equal to or greater than 10.

3. The boundary acoustic wave resonator according to claim 1, wherein N is equal to or less than 50.

4. The boundary acoustic wave resonator according to claim 1, further comprising a second dielectric layer that is laminated on the dielectric layer and is made of a dielectric substance having a velocity of sound higher than that of the dielectric layer.

5. A ladder filter comprising:
    series arm resonators; and
    parallel arm resonators; wherein
    at least two resonators of the series arm resonators and the parallel arm resonators are the boundary acoustic wave resonators according to claim 1.

6. The ladder filter according to claim 5, wherein
    outer sides of the first and second busbars of the first and second boundary acoustic wave resonators which are opposite sides to which one of the first and second electrode fingers and one of the second and first dummy electrodes are connected are inclined so that the outer sides are located a predetermined distance from the envelope; and
    the second busbar of the second boundary acoustic wave resonator is disposed outside the outer side of the first busbar of the first boundary acoustic wave resonator in a direction perpendicular or substantially perpendicular to the boundary acoustic wave propagating direction.

* * * * *